United States Patent
Lin et al.

(10) Patent No.: US 9,287,001 B2
(45) Date of Patent: Mar. 15, 2016

(54) SHIFT REGISTER CIRCUIT

(71) Applicant: AU OPTRONICS CORP., Hsin-Chu (TW)

(72) Inventors: Wei-Li Lin, Hsin-Chu (TW); Chun-Huan Chang, Hsin-Chu (TW); Che-Wei Tung, Hsin-Chu (TW); Shu-Fang Hou, Hsin-Chu (TW)

(73) Assignee: AU POTRONICS CORP., Hsin-Chu (TW)

( * ) Notice: Subject to any disclaimer, the term of this patent is extended or adjusted under 35 U.S.C. 154(b) by 208 days.

(21) Appl. No.: 14/057,317

(22) Filed: Oct. 18, 2013

(65) Prior Publication Data

US 2014/0369457 A1    Dec. 18, 2014

(30) Foreign Application Priority Data

Jun. 14, 2013  (TW) .............................. 102121249 A (51) Int. Cl.
*G11C 19/00* (2006.01)
*G11C 19/28* (2006.01)
*G09G 3/20* (2006.01)

(52) U.S. Cl.
CPC *G11C 19/28* (2013.01); *G09G 3/20* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 7,627,077 B2* | 12/2009 | Wei et al. | ......................... | 377/64 |
| 7,764,086 B2* | 7/2010 | Lu et al. | ........................... | 326/82 |
| 7,778,379 B2* | 8/2010 | Liao et al. | ....................... | 377/64 |
| 7,817,771 B2* | 10/2010 | Tsai et al. | ....................... | 377/64 |
| 7,949,086 B2* | 5/2011 | Tsai et al. | ....................... | 377/64 |
| 8,086,577 B2* | 12/2011 | Handy-Bosma et al. | ..... | 707/694 |
| 8,351,563 B2* | 1/2013 | Yang et al. | ...................... | 377/64 |
| 8,396,183 B2* | 3/2013 | Yang et al. | ...................... | 377/64 |
| 8,537,094 B2* | 9/2013 | Yang et al. | .................... | 345/100 |
| 8,811,567 B2* | 8/2014 | Wu et al. | ......................... | 377/64 |
| 2008/0101529 A1* | 5/2008 | Tobita | ............................. | 377/64 |
| 2012/0169581 A1* | 7/2012 | Su et al. | ........................ | 345/100 |
| 2013/0028370 A1* | 1/2013 | Kikuchi et al. | .................. | 377/64 |

* cited by examiner

*Primary Examiner* — Tuan T Lam
(74) *Attorney, Agent, or Firm* — WPAT, PC; Justin King (57) ABSTRACT

A shift register circuit includes a first pull-down control circuit, a first pull-down circuit electrically connecting to the first pull-down control circuit, a first inversed pulse signal coupling circuit outputting a first inversed pulse signal, a first pull-up circuit outputting a first gate control signal, and a first main pull-down circuit electrically connecting to the first pull-up circuit. The first pull-up circuit receives a first driving signal and a first pulse signal to output the first gate control signal. The first inversed pulse signal coupling circuit duly outputs the first inversed pulse signal to compensate a surge occurring in the first driving signal.

9 Claims, 6 Drawing Sheets

SHIFT REGISTER CIRCUIT

CROSS-REFERENCE TO RELATED APPLICATIONS

This non-provisional application claims priority under 35 U.S.C. §119(a) on Patent Application No(s). 102121249 filed in Taiwan, R.O.C. on Jun. 14, 2013, the entire contents of which are hereby incorporated by reference.

TECHNICAL FIELD

The disclosure relates to a shift register structure applicable to a display device, more particularly to a shift register circuit disposed in a display device and capable of automatic compensation.

BACKGROUND

With the enhancement of the display panel technology, people have more serious requirements regarding the display panel, especially regarding the edge width of the display panel. Moreover, the manufacture cost is expected to be lower and meanwhile the display panel maintains its function. Based on the aforementioned requirements, the Gate Driver on Array (GOA) has been replacing the shift registers in a conventional gate driving integration circuit. The GOA circuit requires a Q signal, an internal signal within the GOA circuit, for driving the shift register. A RC (resistor-capacitor) load corresponding to the Q signal is small, so the Q signal is easily interfered by a high frequency signal and has a voltage potential higher than 0 volt. This causes that the thin-film transistor (TFT) in the display device is regularly turned on, resulting in the power waste and the reduction of the lifetime of the TFT.

To reduce the interference occurring on the Q signal, the convention resolution is to couple an inversed pulse signal to the Q signal, no matter if the Q signal requires the inversed pulse signal or not. This will reduce the driving ability of the circuit.

SUMMARY

A shift register circuit according to an embodiment of the disclosure includes a first pull-down control circuit, a first pull-down circuit electrically connecting to the first pull-down control circuit, a first inversed pulse signal coupling circuit configured to output a first inversed pulse signal, a first pull-up circuit configured to output a first gate control signal, and a first main pull-down circuit electrically connecting to the first pull-up circuit. The first pull-up circuit receives a first driving signal and a first pulse signal to output the first gate control signal. When a first control signal transmitted in the first pull-down control circuit is at a first preset logic level, the first pull-down control circuit disables the first inversed pulse signal coupling circuit. The first main pull-down circuit changes the first driving signal, and then when the first control signal of the first pull-down control circuit is not at the first preset logic level according to the changed first driving signal, the first inversed pulse signal coupling circuit outputs the first inversed pulse signal to compensate a surge occurring in the first driving signal.

BRIEF DESCRIPTION OF THE DRAWINGS

The present disclosure will become more fully understood from the detailed description given herein below for illustration only and thus does not limit the present disclosure, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
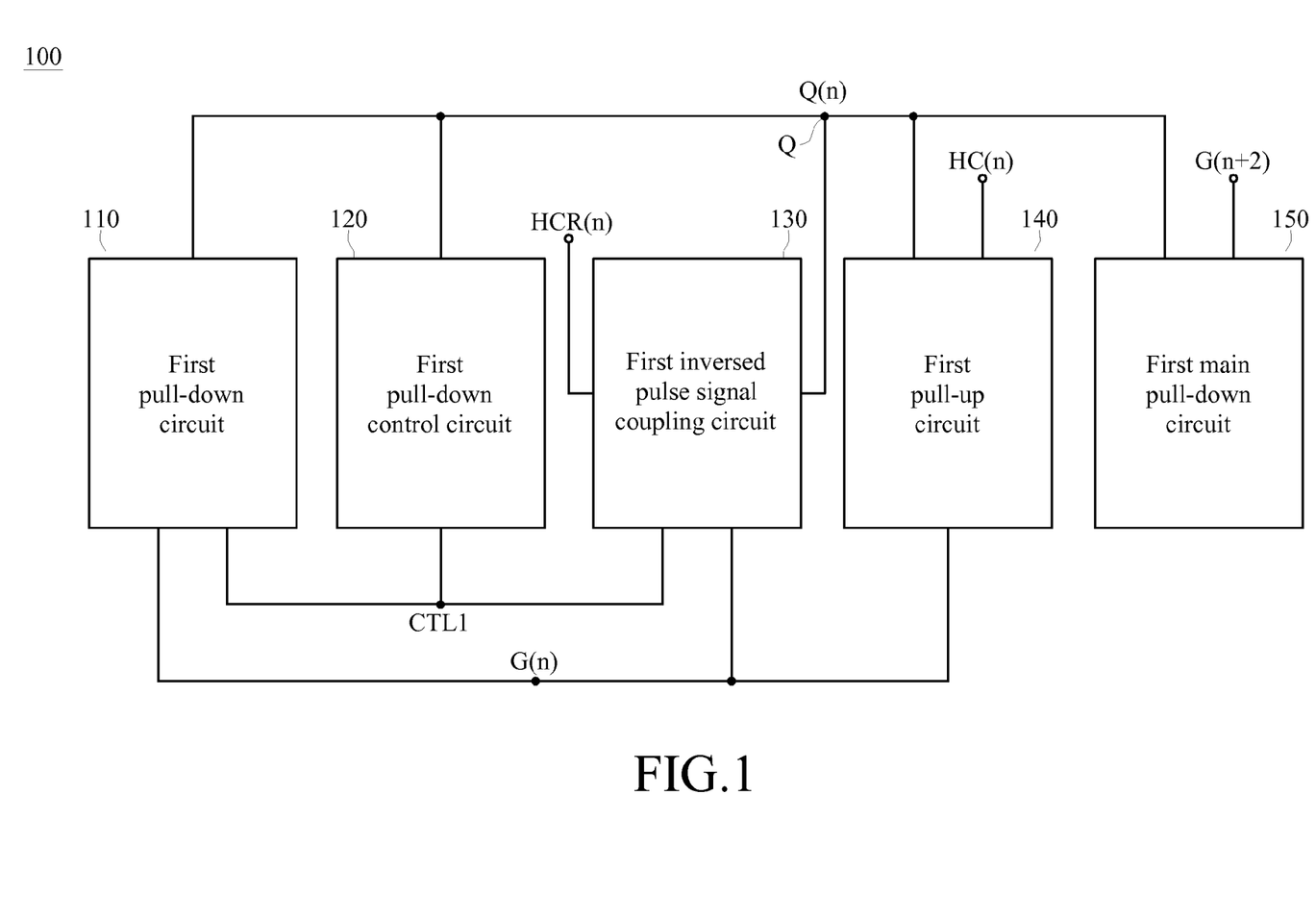
FIG. 1 is a block diagram of a shift register circuit according to an embodiment of the disclosure.

FIG. 1 is a block diagram of a shift register circuit according to an embodiment of the disclosure. A shift register circuit 100 includes a first pull-down circuit 110, a first pull-down control circuit 120, a first inversed pulse signal coupling circuit 130, a first pull-up circuit 140 and a first main pull-down circuit 150. The first pull-down circuit 110, the first pull-down control circuit 120, the first inversed pulse signal coupling circuit 130, the first pull-up circuit 140 and the first main pull-down circuit 150 electrically connect to a node Q.

The first pull-up circuit 140 is configured to receive a first driving signal Q(n) sent by the node Q, and a first pulse signal HC(n) to output a first gate control signal G(n). The first pull-down circuit 110, the first inversed pulse signal coupling circuit 130 and the first pull-up circuit 140 are configured to control an output waveform of the first gate control signal G(n). In this and some embodiments, the first main pull-down circuit 150 receives a third gate control signal G(n+2) outputted by a (n+2)th stage shift register circuit or other stage shift register circuits. The first pull-down control circuit 120 electrically connects to the first pull-down circuit 110 and the first inversed pulse signal coupling circuit 130. The first pull-down control circuit 120 is configured to receive a DC signal and output the first control signal CTL1 to drive the first pull-down circuit 110, and meanwhile control the first inversed pulse signal coupling circuit 130 to output a first inversed pulse signal HCR(n) which will be coupled to the first driving signal Q(n).

When the first control signal CTL1 outputted by the first pull-down control circuit 120 is at a first preset logic level, the first pull-down control circuit 120 will not enable the first inversed pulse signal coupling circuit 130. When the voltage potential of the third gate control signal G(n+2) is changed, the first main pull-down circuit 150 will change the voltage potential of the first driving signal Q(n). When the first control signal CTL1 outputted by the first pull-down control circuit 120 is not at the first preset logic level according to the first driving signal Q(n), the first inversed pulse signal coupling circuit 130 outputs the first inversed pulse signal HCR(n) to compensate a surge in the first driving signal Q(n).

In the disclosure, transistors are taken as exemplary switch units to illustrate the operation of the following shift register circuits.

Figure 2:
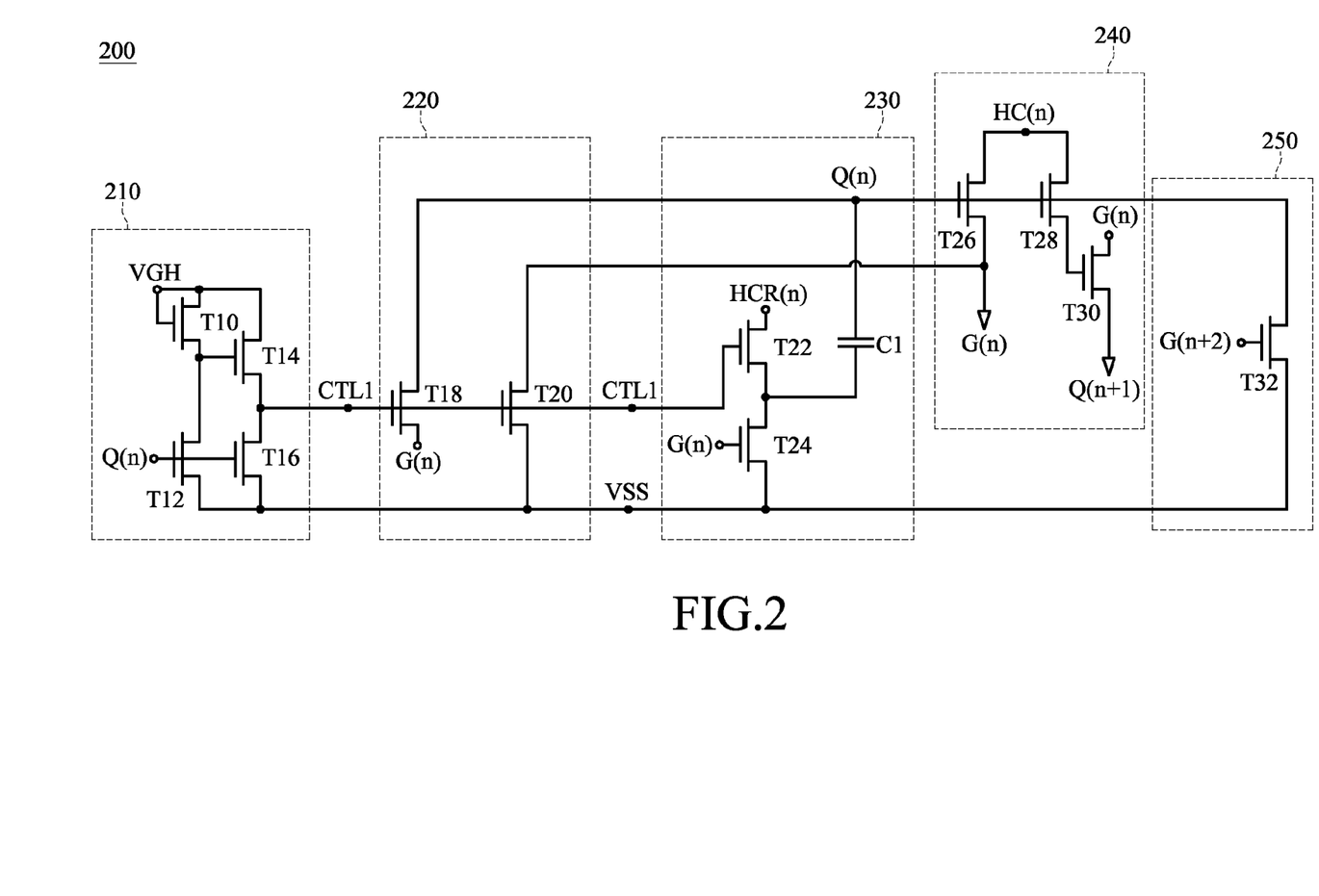
FIG. 2 is a circuitry diagram of a shift register circuit implemented in FIG. 1 according to an embodiment of the disclosure.

FIG. 2 is a circuitry diagram of the shift register circuit implemented in FIG. 1 according to an embodiment of the disclosure. Assume that a shift register circuit 200 is a n-th stage shift register circuit and outputs a second driving signal Q(n+1) to a (n+1)th stage shift register circuit. The shift register circuit 200 includes a first pull-down control circuit 210, a first pull-down circuit 220, a first inversed pulse signal coupling circuit 230, a first pull-up circuit 240 and a first main pull-down circuit 250.

The first pull-down control circuit 210 connects to a first signal node VGH and receives a first driving signal Q(n) to output a first control signal CTL1 to the first pull-down circuit 220 and the first inversed pulse signal coupling circuit 230. The first driving signal Q(n) is used for driving the n-th stage shift register circuit 200, and the second driving signal Q(n+1) is used for driving the (n+1)th stage shift register circuit.

The first inversed pulse signal coupling circuit 230 receives the first control signal CTL1 from the first pull-down control circuit 210 and couples a first inversed pulse signal HCR(n) to the first driving signal Q(n) via a first capacitor C1. The first pull-up circuit 240 receives the first driving signal Q(n) and a first pulse signal HC(n) to output the first gate control signal G(n), and moreover receives the first gate control signal G(n) to output the second driving signal Q(n+1).

The first pull-down control circuit 210 further includes a first transistor T10, a second transistor T12, a third transistor T14 and a fourth transistor T16. The gate of the first transistor T10 electrically connects to the drain of the first transistor T10, the drain of the third transistor T14 and the first signal node VGH. The source of the first transistor T10 electrically connects to the drain of the second transistor T12 and the gate of the third transistor T14. The source of the third transistor T14 electrically connects to the drain of the fourth transistor T16. The gate of the second transistor T12 and the gate of the fourth transistor T16 are supplied with the first driving signal Q(n). The source of the second transistor T12 and the source of the fourth transistor T16 electrically connect to a second signal node VSS.

The first pull-down circuit 220 includes a fifth transistor T18 and a sixth transistor T20. The gate of the fifth transistor T18 is supplied with the first control signal CTL1, the source of the fifth transistor T18 is supplied with the first gate control signal G(n), and the drain of the fifth transistor T18 is supplied with the first driving signal Q(n). The gate of the sixth transistor T20 is supplied with the first control signal CTL1, the source of the sixth transistor T20 electrically connects to the second signal node VSS, and the drain of the sixth transistor T20 is supplied with the first gate control signal G(n). The first transistor T10 and the third transistor T14 cooperate as a resistor to provide a preset DC voltage. The second transistor T12 and the fourth transistor T16 receive the first driving signal Q(n) to output the first control signal CTL1.

The first inversed pulse signal coupling circuit 230 includes a seventh transistor T22, a eighth transistor T24 and the first capacitor C1. The gate of the seventh transistor T22 is supplied with the first control signal CTL1, the drain of the seventh transistor T22 is supplied with the first inversed pulse signal HCR(n), and the source of the seventh transistor T22 electrically connects to the source of the eighth transistor T24 and a first end of the first capacitor C1. A second end of the first capacitor C1 is supplied with the first driving signal Q(n), the gate of the eighth transistor T24 is supplied with the first gate control signal G(n), and the source of the eighth transistor T24 electrically connects to the second signal node VSS.

The first pull-up circuit 240 includes a ninth transistor T26, a tenth transistor T28 and an eleventh transistor T30. The gate of the ninth transistor T26 electrically connects to the gate of the tenth transistor T28 and is supplied with the first driving signal Q(n), the drain of the ninth transistor T26 electrically connects to the drain of the tenth transistor T28 and is supplied with the first pulse signal HC(n), the source of the ninth transistor T26 is supplied with the first gate control signal G(n). The source of the tenth transistor T28 electrically connects to the gate of the eleventh transistor T30. The drain of the eleventh transistor T30 is supplied with the first gate control signal G(n), and the source of the eleventh transistor T30 is supplied with the second driving signal Q(n+1). The ninth transistor T26 receives the first pulse signal HC(n) and the first driving signal Q(n) to output the first gate control signal G(n). The tenth transistor T28 receives the first pulse signal HC(n) and the first driving signal Q(n) to control the eleventh transistor T30 to output the second driving signal Q(n+1).

The first main pull-down circuit 250 includes a twelfth transistor T32. The drain of the twelfth transistor T32 is supplied with the first gate control signal G(n), the gate of the twelfth transistor T32 is supplied with the third gate control signal G(n+2), and the source of the twelfth transistor T32 electrically connects to the second signal node VSS.

When the third gate control signal G(n+2) is changed, the first driving signal Q(n) will be changed. Whether the first inversed pulse signal coupling circuit 230 is enabled or not, and whether the first inversed pulse signal HCR(n) is coupled to the first driving signal Q(n) or not, are based on the first control signal CTL1.

Specifically, when the first driving signal Q(n) is at a first preset logic level, the second transistor T12 and the fourth transistor T16 are turned on. Herein, the voltage potential of the first control signal CTL1 will be dropped to be the same as the voltage potential of the second signal node VSS. Assume that the first preset logic level is a high logic level. The first control signal CTL1 will be at the low logic level. When the first control signal CTL1 is at the low logic level, the first pull-down control circuit 210 will not turn on the seventh transistor T22. Herein, the first inversed pulse signal HCR(n) will not be outputted through the first capacitor C1. In other words, the first inversed pulse signal coupling circuit 230 will not be enabled.

The second driving signal Q(n+1) is outputted to the (n+1)th stage shift register circuit defined as a second shift register circuit in a display device. The second shift register circuit includes a second pull-down control circuit, a second pull-down circuit, a second inversed pulse signal coupling circuit, a second pull-up circuit and a second main pull-down circuit. The components in the second shift register circuit and the operation thereof are similar to the shift register circuit 200 defined as a first shift register circuit. In other words, when a second control signal outputted by the second pull-down control circuit is at a second preset logic level, the second pull-down control circuit will not enable the second inversed pulse signal coupling circuit. When the second control signal is not at the second preset logic level, the second inversed pulse signal coupling circuit will be enabled to output the second inversed pulse signal and couple the second inversed pulse signal to the second driving signal, so as to compensate the surge in the second driving signal. When the voltage potential of the third gate control signal G(n+2) outputted by the second shift register circuit is changed from a low logic level to a high logic level, the first main pull-down circuit 250 will change the voltage potential of the first driving signal Q(n), and then the first driving signal will be changed from a high logic level to a low level. When the first control signal CTL1 is not at the first preset logic level according to the changed first driving signal Q(n) (that is, the first control signal CTL1 is changed from its low logic level to its high logic level), the first inversed pulse signal coupling circuit 230 will be enabled to output the first inversed pulse signal HCR (n) to compensate the surge in the first driving signal Q(n).

Even through the embodiment in FIG. 2 only shows one pull-down control circuit, i.e. the first pull-down control circuit 210, one pull-down circuit, i.e. the first pull-down circuit 220, one inversed pulse signal coupling circuit, i.e. the first inversed pulse signal coupling circuit 230, one pull-up circuit, i.e. the first pull-up circuit 240, and one main pull-down circuit, i.e. the first main pull-down circuit 250, the numbers of these components can be designed according to real application requirements. For example, the shift register circuit 200 can further include another pull-down control circuit, another pull-down circuit, another inversed pulse signal coupling circuit, another pull-up circuit and another main pull-down circuit.

Figure 3:
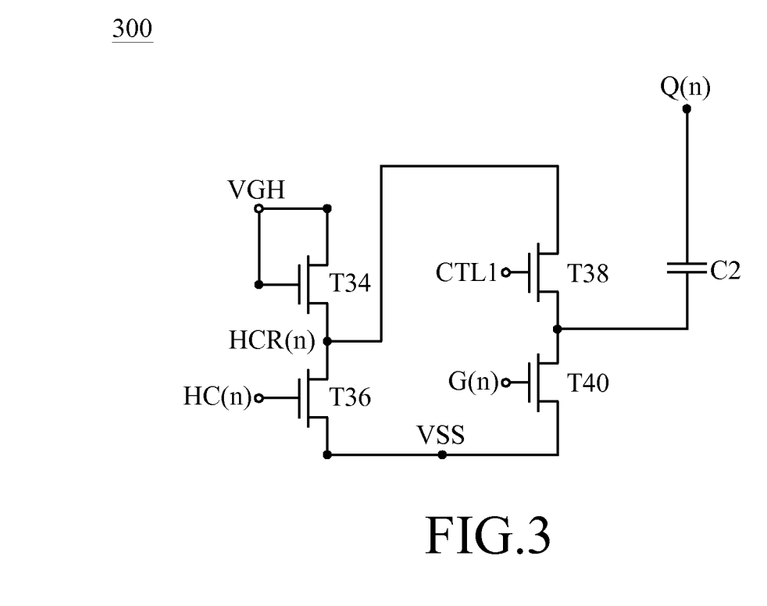
FIG. 3 is a circuitry diagram of a first inversed pulse signal coupling circuit according to an embodiment of the disclosure.

FIG. 3 is a circuitry diagram of a first inversed pulse signal coupling circuit according to an embodiment of the disclosure. The first inversed pulse signal coupling circuit 300 includes a thirteenth transistor T34, a fourteenth transistor T36, a fifteenth transistor T38, a sixteenth transistor T40 and a second capacitor C2.

The gate of the thirteenth transistor T34 electrically connects to the drain of the thirteenth transistor T34 and a first signal node VGH, and the source of the thirteenth transistor T34 electrically connects to the drain of the fourteenth transistor T36 and the drain of the fifteenth transistor T38. The gate of the fourteenth transistor T36 is supplied with a first pulse signal HC(n), the source of the fourteenth transistor T36 electrically connects to the source of the sixteenth transistor T40 and a second signal node VSS. The source of the fifteenth transistor T38 electrically connects to the drain of the sixteenth transistor T40 and a first end of the second capacitor C2, and the gate of the fifteenth transistor T38 is supplied with a first control signal CTL1. The gate of the sixteenth transistor T40 is supplied with a first gate control signal G(n). In this or some embodiments, the first signal node VGH provides a DC voltage.

The difference between the embodiments in FIG. 2 and FIG. 3 is that the first inversed pulse signal coupling circuit 300 in FIG. 3 further includes a thirteenth transistor T34 and a fourteenth transistor T36 which cooperate to form an inverter which inverts the first pulse signal HC(n) to the first inversed pulse signal HCR(n), whereby the shift register circuit including the first inversed pulse signal coupling circuit 300 does not require an extra first inversed pulse signal HCR (n) provided by an external end. In other words, the first inversed pulse signal coupling circuit 300 in the shift register circuit can directly invert the first pulse signal HC(n) into the first inversed pulse signal HCR(n). The thirteenth transistor T34 works as a resistor. In this way, even though the number of the pulse signals increases, the number of the pins in the shift register circuit may not increase with the number of the pulse signals.

Figure 4:
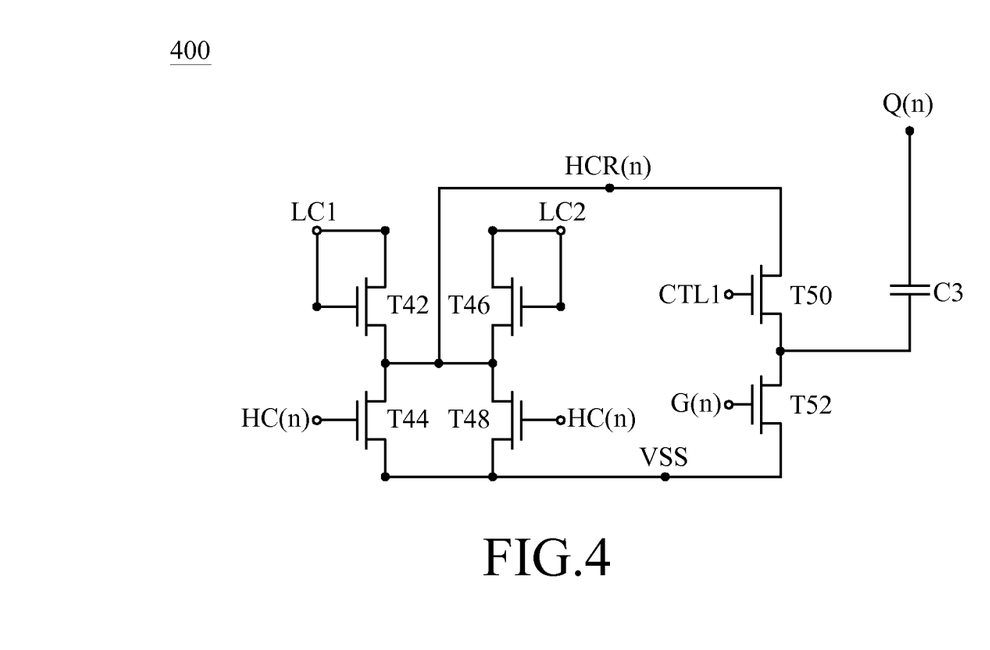
FIG. 4 is a circuitry diagram of a first inversed pulse signal coupling circuit according to an embodiment of the disclosure.

FIG. 4 is a circuitry diagram of a first inversed pulse signal coupling circuit according to an embodiment of the disclosure. A first inversed pulse signal coupling circuit 400 includes a seventeenth transistor T42, a eighteenth transistor T44, a nineteenth transistor T46, a twentieth transistor T48, a twenty-first transistor T50, a twenty-second transistor T52 and a third capacitor C3.

The gate of the seventeenth transistor T42 electrically connects to the drain of the seventeenth transistor T42 and a first voltage node LC1, and the source of the seventeenth transistor T42 electrically connects to the drain of the eighteenth transistor T44, the source of the nineteenth transistor T46, the drain of the twentieth transistor T48 and the drain of the twenty-first transistor T50. The first inversed pulse signal HCR(n) is provided at the node where the source of the seventeenth transistor T42, the drain of the eighteenth transistor T44, the source of the nineteenth transistor T46, the drain of the twentieth transistor T48 and the drain of the twenty-first transistor T50 join together. The gate of the eighteenth transistor T44 and the gate of the twentieth transistor T48 are supplied with a first pulse signal HC(n). The source of the eighteenth transistor T44 electrically connects to the source of the twentieth transistor T48, the source of the twenty-second transistor T52 and the second signal node VSS. The gate of the nineteenth transistor T46 electrically connects to the drain of the nineteenth transistor T46 and a second voltage node LC2. The source of the twenty-first transistor T50 electrically connects to the drain of the twenty-second transistor T52 and a first end of the third capacitor C3, and the gate of the twenty-second transistor T52 is supplied with the first gate control signal G(n).

The seventeenth transistor T42 and the nineteenth transistor T46 respectively work as resistors, so as to supply a voltage for the following operation. The eighteenth transistor T44 and the twentieth transistor T48 invert the first pulse signal HC(n) into a first inversed pulse signal HCR(n). For example, the first voltage node LC1 and the second voltage node LC2 supply a low-frequency signal having a frequency smaller than that of the first pulse signal.

Difference between the first inversed pulse signal coupling circuit 300 in FIG. 3 and the first inversed pulse signal coupling circuit 400 in FIG. 4 is that the first inversed pulse signal coupling circuit 400 does not require the DC voltage supplied to the inverter in FIG. 3 but employs the low-frequency signal LC1 and the second voltage node LC2 which are well known in the conventional shift register circuit, thereby reducing the effect of DC stress and extending the life of the shift register circuit.

Figure 5:
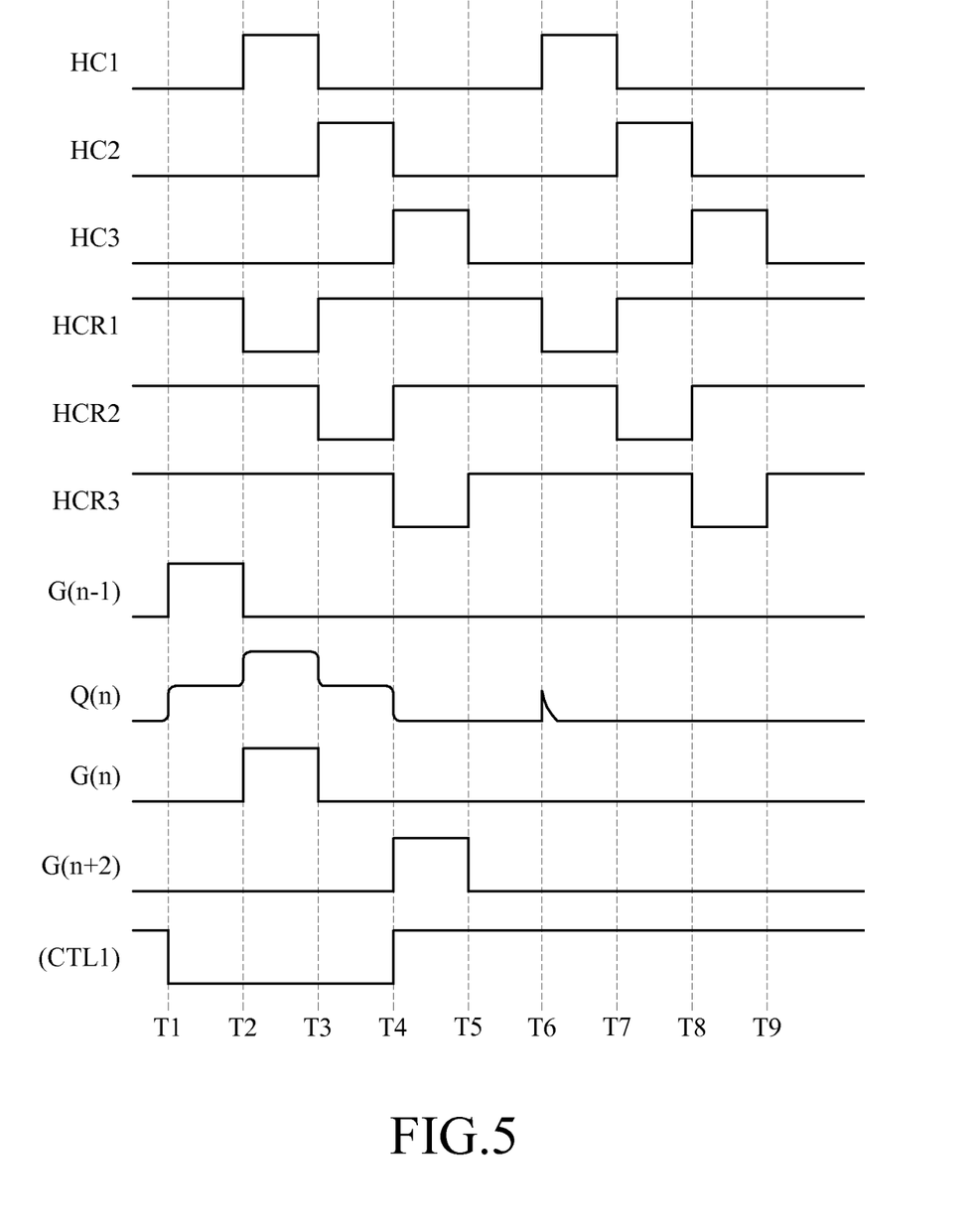
FIG. 5 is a time sequence waveform diagram of the shift register circuit according to an embodiment of the disclosure.

The following exemplary illustration based on the shift register circuit 200 in FIG. 2 is taken to describe the operation of the shift register circuit in the disclosure. Refer to FIG. 5 and FIG. 2, when the previous stage shift register circuit outputs the gate control signal G(n−1) at the high logic level to be coupled with the first driving signal Q(n) of the current stage shift register circuit 200, the voltage potential of the first driving signal Q(n) will be increased to be at a certain level. For example, during the time period between the time points T1 and T2, the gate control signal G(n−1) of the previous stage shift register circuit is at its high logic level, and the first driving signal Q(n) is increased to be at a certain logic level higher than its previous voltage potential before the time point T1.

Herein, the second transistor T12 and the fourth transistor T16 are turned on, the voltage potential of the first control signal CTL1 at the time point T1 is dropped to be the same as the voltage potential at the second signal node VSS. When the first control signal CTL1 is at a low logic level during the time period between the time points T1 and T4, the first pull-down control circuit 210 will not turn on the seventh transistor T22, so that the first inversed pulse signal HCR(n) can not be outputted via the first capacitor C1. In other words, the seventh transistor T22 is turned off during the time period between the time points T1 and T4, so that the first inversed pulse signal coupling circuit 230 does not output the first inversed pulse signal HCR(n). Subsequently, when the first pulse signal HC1 is changed from a low logic level to a high logic level during the time period between the time points T2 and T3, the first pulse signal HC1 will be coupled to the first driving signal Q(n). Herein, the voltage potential of the first driving signal Q(n) is increased to a higher logic level.

At the time point T4, the gate control signal G(n+2) outputted by the second shift register circuit is changed from a low logic level to a high logic level, and the twelfth transistor T32 changes the voltage potential of the first driving signal Q(n), whereby the voltage potential of the first control signal CTL1 is changed to be at a high logic level to enable the seventh transistor T22. When the seventh transistor T22 is enabled, the first inversed pulse signal coupling circuit 230 outputs the first inversed pulse signal HCR1. In other words, when the first pulse signal HC1 is at a high logic level at the time point T6, the first inversed pulse signal coupling circuit 230 will output the first inversed pulse signal HCR1 to compensate the surge in the first driving signal Q(n). For example, the logic level of the first pulse signal HC1, the logic level of the second pulse signal HC2 and the logic level of the third pulse signal HC3 can sequentially change, and so does the logic level of the first inversed pulse signal HCR1, the logic level of the second inversed pulse signal HCR2 and the logic level of the third inversed pulse signal HCR3. Even though there are only three pulse signals in FIG. 2, the disclosure will not be limited thereby.

Figure 6:
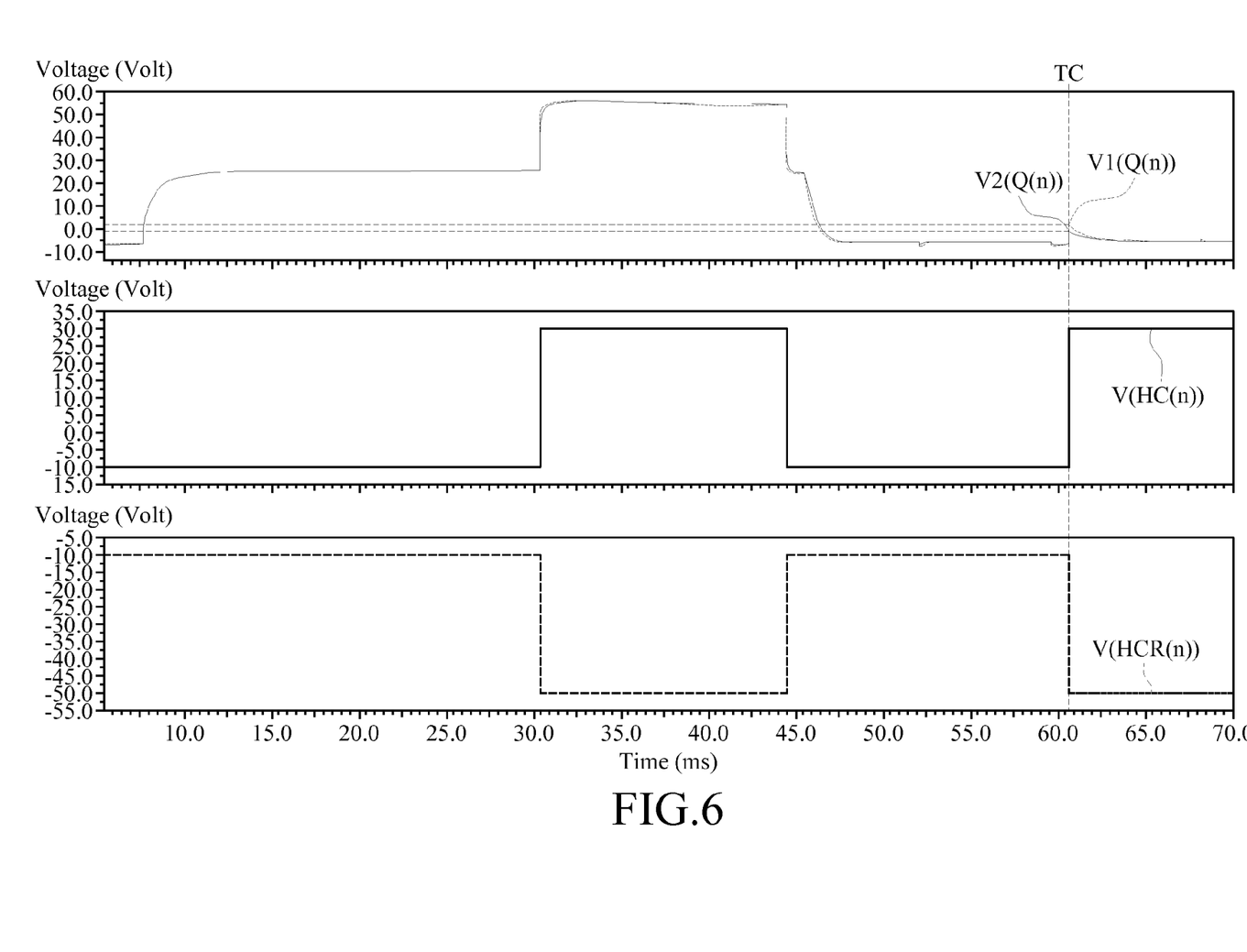
FIG. 6 is a simulation waveform diagram of the shift register circuit according to an embodiment of the disclosure.

Furthermore, a simulation result about the shift register circuit 200 is presented in FIG. 6 which is a simulation waveform diagram of the shift register circuit according to an embodiment of the disclosure. In FIG. 6, V1(Q(n)) represents a voltage potential of the first driving signal Q(n) in the conventional shift register circuit (not shown), V2(Q(n)) represents a voltage potential of the first driving signal Q(n) in the shift register circuit 200, V(HC(n)) represents a voltage potential of the first pulse signal HC(n), and V(HCR(n)) represents a voltage potential of the first inversed pulse signal HCR(n) in the shift register circuit 200.

When the first pulse signal HC(n) becomes a high logic level at the time point TC, the voltage potential V2(Q(n)) is lower than the voltage potential V1(Q(n)). In other words, the first driving signal Q(n) of the shift register circuit 200 may have a smaller surge at the time point TC. Specifically, the first inversed pulse signal coupling circuit 230 outputs the first inversed pulse signal HCR(n) to compensate the surges in the first driving signal Q(n), thereby reducing the voltage potential V2(Q(n)).

The smaller surge indicates the better signal quality and affects the circuitry less. In this case, the voltage potential V1(Q(n)) of the conventional shift register circuit and of the shift register circuit 200 at the time point TC are 2 Volt, and the voltage potential V2(Q(n)) at the time point TC is −2 Volt. In this way, the shift register circuit 200 may efficiently reduce the surge in the first driving signal Q(n). The disclosure will not be limited by this case.

Accordingly, the shift register circuit of the disclosure disposed in the display device may hold the driving ability and efficiently reduce surges in the driving signal without any external pulse signal and more pins for the external power, thereby reducing the needless power consumption and avoiding the damage of transistors.

What is claimed is:
1. A shift register circuit, comprising:
a first pull-down control circuit;
a first pull-down circuit electrically connecting to the first pull-down control circuit;
a first inversed pulse signal coupling circuit configured to output a first inversed pulse signal;
a first pull-up circuit configured to receive a first driving signal and a first pulse signal to output a first gate control signal; and
a first main pull-down circuit electrically connecting to the first pull-up circuit and configured to control the first driving signal;
wherein when a first control signal outputted by the first pull-down control circuit is at a first preset logic level, the first pull-down control circuit disables the first inversed pulse signal coupling circuit, and when the first control signal outputted by the first pull-down control circuit is not at the first preset logic level, the first inversed pulse signal coupling circuit outputs the first inversed pulse signal; and
wherein the first inversed pulse signal coupling circuit comprises a first transistor, and the first transistor is configured to receive the first inversed pulse signal and via a first capacitor, couple the first inversed pulse signal to the first driving signal.

2. The shift register circuit according to claim 1, wherein the first inversed pulse signal coupling circuit further comprises a first inverter which is configured to receive the first pulse signal to output the first inversed pulse signal.

3. The shift register circuit according to claim 1, wherein the first inversed pulse signal coupling circuit is supplied with a DC voltage.

4. The shift register circuit according to claim 1, wherein the first inversed pulse signal coupling circuit is configured to receive a low-frequency signal whose frequency is lower than a frequency of the first pulse signal.

5. The shift register circuit according to claim 1, wherein the first preset logic level is a low logic level.

6. The shift register circuit according to claim 1, wherein the first pull-down control circuit is configured to receive a DC signal.

7. A shift register circuit, comprising:
a first pull-down control circuit;
a first pull-down circuit electrically connecting to the first pull-down control circuit;
a first inversed pulse signal coupling circuit configured to output a first inversed pulse signal, the first inversed pulse signal coupling circuit comprising:
a capacitor having a first terminal and a second terminal, the first terminal coupled to a first pull-up circuit to adjust a first driving signal;
a first switch configure to selectively adjust a voltage level at the second terminal of the capacitor to the first inversed pulse signal based on a first control signal; and
a second switch configure to selectively build a second current path between a second signal node and the second terminal of the capacitor based on a first gate control signal;
the first pull-up circuit configured to receive the first driving signal and a first pulse signal to output the first gate control signal; and
a first main pull-down circuit electrically connecting to the first pull-up circuit and configured to control the first driving signal;
wherein when the first control signal outputted by the first pull-down control circuit is at a first preset logic level, the first pull-down control circuit disables the first inversed pulse signal coupling circuit, and when the first control signal outputted by the first pull-down control circuit is not at the first logic level according to a variation of the first driving signal, the first inversed pulse signal coupling circuit outputs the first inversed pulse signal to compensate a surge in the first driving signal.

8. The shift register circuit according to claim 7, wherein the first inversed pulse signal coupling circuit further comprises:
   a third switch configured to pull up a voltage level of the inversed pulse signal to a voltage level at a first signal node; and
   a fourth switch configure to pull down the voltage level of the inversed pulse signal based on the first pulse signal.

9. The shift register circuit according to claim 8, wherein the first inversed pulse signal coupling circuit further comprises:
   a fifth switch configured to pull up a voltage level of the inversed pulse signal to a voltage level at a third signal node; and
   a sixth switch configure to pull down the voltage level of the inversed pulse signal based on the first pulse signal.

* * * * *